(12) United States Patent
Adams et al.

(10) Patent No.: US 6,208,572 B1
(45) Date of Patent: Mar. 27, 2001

(54) SEMICONDUCTOR MEMORY DEVICE HAVING RESISTIVE BITLINE CONTACT TESTING

(75) Inventors: R. Dean Adams, St. George; Robert E. Busch, Essex Junction; Harold Pilo, Underhill; George E. Rudgers, Essex, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/592,055

(22) Filed: Jun. 12, 2000

(51) Int. Cl.[7] .................................................. G11C 29/00
(52) U.S. Cl. ............................................ 365/201; 365/63
(58) Field of Search ............................. 365/201, 63, 190, 365/154

(56) References Cited

U.S. PATENT DOCUMENTS

| | | | |
|---|---|---|---|
| 5,250,854 | * 10/1993 | Lien | 327/530 |
| 5,291,433 | 3/1994 | Itoh | 365/63 |
| 5,463,580 | 10/1995 | Nakamura | 365/189.01 |
| 5,491,665 | * 2/1996 | Sachdev | 365/201 |
| 5,550,771 | 8/1996 | Hatori | 365/174 |
| 5,872,018 | * 2/1999 | Lee | 438/18 |

\* cited by examiner

Primary Examiner—Son Mai
(74) Attorney, Agent, or Firm—Schmeiser, Olsen & Watts; Steven Capella

(57) ABSTRACT

A semiconductor memory device having resistive bitline contact testing includes memory cells, and wordline logic devices for concurrently activating two adjacent memory cells. The two adjacent memory cells are activated concurrently to allow higher current through a bitline contact for improved detection of resistive bitline contacts. A test cell may also be included to test the integrity of the bitline contact.

20 Claims, 2 Drawing Sheets

SEMICONDUCTOR MEMORY DEVICE HAVING RESISTIVE BITLINE CONTACT TESTING

BACKGROUND OF THE INVENTION

1. Technical Field

The invention relates generally to semiconductor memory devices, and more specifically, to test circuitry for semiconductor memory devices.

2. Related Art

A typical semiconductor static random-access memory (SRAM) device includes word lines, a pair of bit lines, and memory cells with cell latches and pass devices connected at intersections between the word lines and the pair of bit lines. The pass devices of the memory cells are connected to the pair of bit lines through bitline contacts. During a read or write operation, these bitline contacts allow the contents of the memory cell to be successfully read from or written into the cell latch. Bitline contacts that have too much resistance (resistive bitline contacts) will not properly allow the memory cell to be read from or written into. Resistive bitline contacts may occur as a result of mechanical failures or non-conductive materials that are formed between the pass devices and the bitline, and are hard to detect since the pass devices have a large series resistance (e.g., typically in the 10K ohm range) compared to the resistive bitline contact.

Although bitline contacts may be tested with the testing of the memory cell or bitlines, most manufacturing tests have difficulty recognizing a borderline resistive bitline contact and will generally pass the bitline contact and memory cell. When the resistive bitline contact is then used in the system under a slightly different voltage and/or temperature, the resistive bitline contact may then fail, rendering the corresponding memory cell inoperable.

Accordingly, a need has developed in the art for a semiconductor memory device test that will improve detection of resistive bitline contacts.

SUMMARY OF THE INVENTION

The present invention provides a memory device having resistive bitline contact testing, wherein two cells are activated simultaneously to allow higher current through the bitline contact for improved detection of resistive bitline contacts. A test cell may also be included to test the integrity of the bitline contact.

Generally, the present invention provides a memory device comprising:
- a first and second memory cell;
- a bitline for providing data to said first and second memory cell;
- a bitline contact coupling said bitline to said first and second memory cell;
- a first and second wordline signal for activating said first and second memory cell, respectively, to receive said data from said bitline; and
- a wordline logic device, receiving said first and second wordline signal and transmitting said first and second wordline signal to said first and second memory cell, respectively,
- wherein during a test of said bitline contact, said wordline logic device transmits said first and second wordline signal to said first and second memory cell essentially simultaneously.

In addition, the present invention provides a method for testing the resistance of a bitline contact in a memory device having memory cells comprising the steps of:
- a) writing a data value into adjacent memory cells sharing said bitline contact;
- b) reading said data value from said adjacent memory cells essentially simultaneously; and
- c) comparing said read data value of said adjacent memory cells with said written data value.

The present invention also provides an SRAM memory array system comprising:
- a plurality of adjacent memory cells;
- a bitline for transferring data values to or from said plurality of adjacent memory cells;
- a plurality of bitline contacts coupling said bitline to said plurality of adjacent memory cells, each of said plurality of bitline contacts being shared between each of said plurality of adjacent memory cells, respectively;
- a plurality of wordline signals for activating said plurality of adjacent memory cells, for transferring said data values to said bitline; and
- a plurality of wordline logic devices, receiving said plurality of wordline signals, each of said plurality of wordline logic devices receiving two of said plurality of wordline signals, and transmitting said plurality of wordline signals to said plurality of adjacent memory cells,
- wherein during a test of each of said plurality of bitline contacts, each of said plurality of wordline logic devices transmits said two of said plurality of wordline signals to each of said plurality of adjacent memory cells essentially simultaneously.

The foregoing and other features of the invention will be apparent from the following more particular description of embodiments of the invention, as illustrated in the accompanying drawings.

BRIEF DESCRIPTION OF THE DRAWINGS

Embodiments of the present invention will hereinafter be described in conjunction with the appended drawings, where like designations denote like elements, and wherein.

DETAILED DESCRIPTION OF THE DRAWINGS

Figure 1:
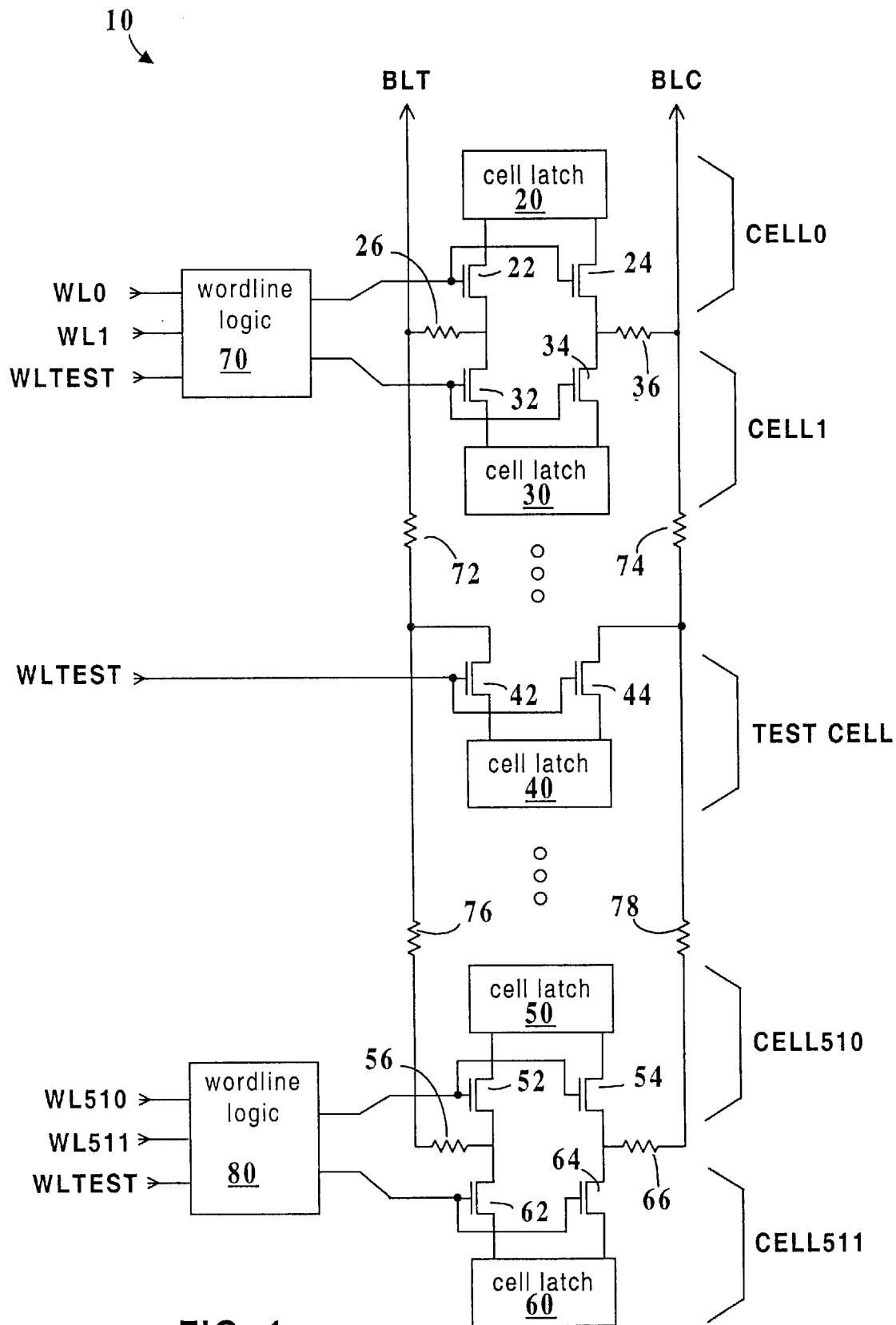
FIG. 1 is a block circuit diagram of a memory device in accordance with an embodiment of the present invention.

FIG. 1 illustrates a block circuit diagram of memory device 10 having a plurality of wordlines and wordline signals (WL0–WL511), a plurality of wordline logic devices (70,80), a pair of bitlines (BLT and BLC), a plurality of memory cells (CELL0–CELL511) and a test cell (TEST CELL) in accordance with an embodiment of the present invention. Memory device 10 is preferably a static random access memory (SRAM) array, but is not limited to such.

Each memory cell includes pass gates and a cell latch. For example, CELL0 comprises pass gates 22 and 24 and cell latch 20. CELL1 comprises pass gates 32 and 34 and cell latch 30. CELL 510 comprises pass gates 52 and 54 and cell latch 50. CELL 511 comprises pass gates 62 and 64 and cell latch 60. For CELL0 (and all other memory cells in memory device 10), cell latch 20 generally comprises cross-coupled p- and n-devices as will be shown in greater detail in FIG. 2. Furthermore, other appropriate latches may also be used for cell latch 20 and other cell latches in the present invention.

Pass gates 22 and 24 are n-type field-effect transistors (FETs), wherein the gates of pass gates 22 and 24 receive wordline signal WL0. Pass gate 22 is coupled in series to cell latch 20 and bitline contact 26, which in turn is coupled to bitline BLT. Pass gate 24 is coupled in series to cell latch 20 and bitline contact 36, which in turn is coupled to bitline BLC. CELL1 is similar in structure to CELL0 in that the gates of pass gates 32 and 34 receive the wordline signal WL1, pass gate 32 is coupled in series to cell latch 30 and bitline contact 26, and pass gate 34 is coupled in series to cell latch 30 and bitline contact 36. The other cells (CELL2–CELL511) have the same structure as CELL0 and CELL1. As illustrated in FIG. 1, bitline contact is shared between adjacent vertical cells (e.g., bitline contacts 26 and 36 are shared between CELL0 and CELL1).

Wordline logic devices are connected and used between adjacent vertical cells (e.g., wordline logic device 70 is connected to CELL0 and CELL1). That is, the vertical cells sharing a bitline contact are controlled by one wordline logic device. Two wordlines and a wordline test signal WLTEST are the three inputs into wordline logic devices (e.g., WL0, WL1, and WLTEST are the inputs into wordline logic device 70). As will be explained infra in reference to FIG. 2, wordline test signal WLTEST allows wordline logic device 70 to activate CELL0 and CELL1 essentially simultaneously and thus, test for resistive bitline contacts. Although the same test signal is disclosed for all the memory cells and the test cell (discussed later) of the present invention, other combinations may also be used. For example, a different wordline test signal may be used for each two adjacent memory cells and the test cell. Also, one wordline test signal may be used for all the memory cells and a separate test signal for TEST CELL.

TEST CELL is located at a substantially central location of the bitline. Multiple contacts are made from TEST CELL to the bitline to ensure that there will not be additional bitline contact resistance for the test cell. TEST CELL comprises pass gates 42 and 44 and test cell latch 40. As with the memory cell latches, test cell latch 40 of TEST CELL generally comprises cross-coupled p- and n-devices (see FIG. 2, cell latch 30 for an example). Pass gates 42 and 44 are n-type field-effect transistors (FETs), wherein the gates of pass gates 42 and 44 receive the wordline test signal WLTEST. Pass gate 42 is coupled in series to test cell latch 40 and bitline BLT. Pass gate 44 is coupled in series to test cell latch 40 and bitline BLC. TEST CELL is typically about ten percent smaller than the combination of two memory cells, but the present invention is not limited to this size. That is, the size of TEST CELL is determined by the amount of resistance desired to test the bitline contact, as will be explained in greater detail below.

The resistance of the bitline is represented by resistors 72, 74, 76, and 78.

In operation, the bitlines BLT and BLC receive data from the memory cells (during a read operation) or provide data to the memory cells (during a write operation). BLT receives/sends the true value of the data and BLC receives/sends the complementary value of the data. After the data is written into a cell latch of a memory cell, the cell latch will hold the data until a read operation. Then, during the read operation, the corresponding wordline signal activates the pass gates of the memory cell to allow the data to pass from the cell latch to the bitlines.

During test mode, a data value is written into two adjacent memory cells that are sharing the bitline contact (e.g., CELL0 and CELL1 sharing bitline contact 26). The two adjacent memory cells are then read concurrently, and an undesirable resistive bitline contact is detected either when the data value cannot be read out of the memory cells, or the data value read out of the memory cells is different than the data value that was written into the memory cells. The wordline logic device (e.g., element 70) activates the two adjacent memory cells concurrently when receiving either one or both of the wordlines with WLTEST. That is, after receiving either one or both of the wordlines with WLTEST, the wordline logic device transmits a first and second wordline signal to a first and second memory cell essentially simultaneously. Twice the current may be drawn through the bitline contact, because the two cells are in parallel. Thus, detecting undesirable resistive bitline contacts through the present invention is approximately two times greater than that of prior art testing.

The operation of TEST CELL is similar to that of the memory cells. The test cell latch will hold data until a read operation. Then, during the read operation, a test signal WLTEST activates the pass gates of the test cell to allow the data to pass from the test cell latch to the bitlines.

During test mode, the same data is written into the adjacent memory cells that are to be tested (e.g., CELL0 and CELL1) and the complement of that data is written into TEST CELL. TEST CELL is then accessed concurrently with the memory cells to be tested. Thus, a parallel cell structure is formed between the memory cells and TEST CELL. Since the size of TEST CELL is smaller than the combination of the two memory cells, the data of TEST CELL will be flipped, unless there is enough bitline contact resistance to prevent it. Thus, the size of TEST CELL is determined by the amount of resistance desired to test the bitline contact and allow for the data of TEST CELL to be flipped.

Figure 2:
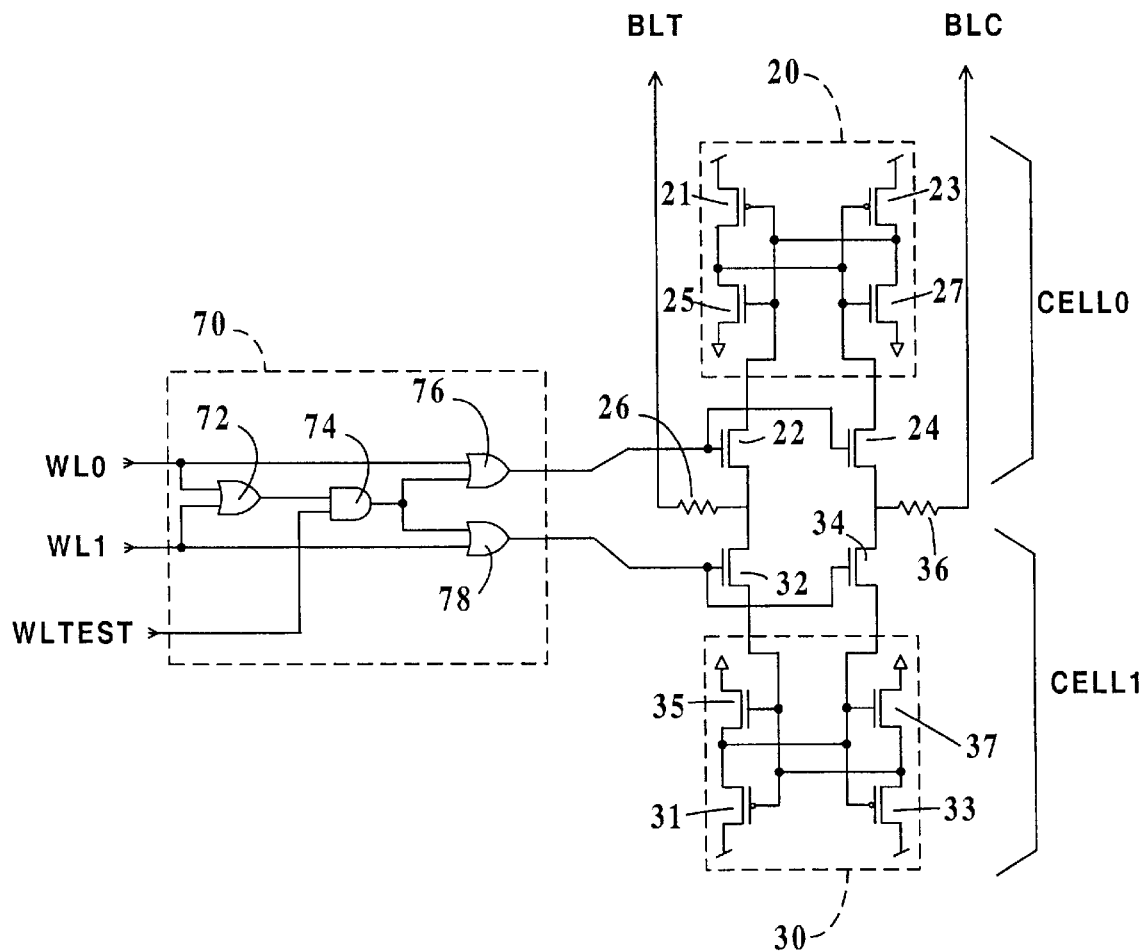
FIG. 2 is a circuit diagram of adjacent memory cells CELL0 and CELL1 and corresponding wordline logic of FIG. 1.

FIG. 2 illustrates a circuit diagram of adjacent memory cells CELL0 and CELL1 of FIG. 1, and the corresponding wordline logic 70 of FIG. 1. Elements 20, 22, 24, 26, 30, 32, 34, 36 and 70 of FIG. 2 are equivalent to corresponding elements in FIG. 1.

As seen in FIG. 2, cell latches 20 and 30 comprise cross-coupled PFET devices 21 and 23 and NFET devices 25 and 27 (cell latch 20) and cross-coupled PFET devices 31 and 33 and NFET devices 35 and 37 (cell latch 30). Specifically, in cell latch 20, NFET 25 and PFET 21 are coupled together in series between ground and Vdd. The gate of NFET 25 is coupled to the gate of PFET 21 and to the drains of NFET 27, PFET 23, and pass gate 22. NFET 27 and PFET 23 are coupled together in series between ground and Vdd. The gate of NFET 27 is coupled to the gate of PFET 23 and to the drains of NFET 25, PFET 21, and pass gate 24.

Similarly, in cell latch 30, NFET 35 and PFET 31 are coupled together in series between ground and Vdd. The gate of NFET 35 is coupled to the gate of PFET 31 and to the drains of NFET 37, PFET 33, and pass gate 32. NFET 37 and PFET 33 are coupled together in series between ground and Vdd. The gate of NFET 37 is coupled to the gate of PFET 33 and to the drains of NFET 35, PFET 31, and pass gate 34.

Wordline logic 70 comprises OR gates 72, 76 and 78 and AND gate 74. Wordlines WL0 and WL1 are inputs into OR gate 72. The output of OR gate 72 and WLTEST are inputs into AND gate 74. The output of AND gate 74 and WL0 are inputs into OR gate 76, and the output of AND gate 74 and WL1 are inputs into OR gate 78. The outputs of OR gates 76 and 78 are inputted into pass gates 22 and 32, respectively.

In operation, wordline logic 70 allows CELL0 and CELL1 to be activated essentially simultaneously when WLTEST indicates a test mode. That is, for this example, when either WL0 or WL1 is high during test mode (i.e., WLTEST is high), both cells CELL0 and CELL1 will be activated. Although for this example, specific devices (e.g., OR gates and AND gates) are used, any other structure or devices that allows two adjacent cells to be activated essentially at the same time may also be used and the present invention is not limited by such.

Thus, this invention provides a semiconductor memory device that allows for an improved detection of resistive bitline contacts by lowering the resistance of surrounding elements while providing twice the current flow through the bitline contact. Furthermore, a test cell is provided to validate the integrity of the bitline contact resistance.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A memory device comprising:
   a first and second memory cell;
   a bitline for transferring a data value to or from said first and second memory cell;
   a bitline contact coupling said bitline to said first and second memory cell;
   a first and second wordline signal for activating said first and second memory cell, respectively, to transfer said data value to said bitline; and
   a wordline logic device, receiving said first and second wordline signal and transmitting said first and second wordline signal to said first and second memory cell, respectively,
   wherein during a test of said bitline contact, said wordline logic device transmits said first and second wordline signal to said first and second memory cell essentially simultaneously.

2. The memory device of claim 1, wherein said first memory cell further comprises:
   a first pass gate, coupled to said bitline contact and said wordline logic device, for passing on said data value to said bitline when activated by said first wordline signal; and
   a first cell latch coupled to said first pass gate for holding said data value until said first pass gate is activated.

3. The memory device of claim 1, wherein said second memory cell further comprises:
   a second pass gate, coupled to said bitline contact and said wordline logic device, for passing on said data value to said bitline when activated by said second wordline signal; and
   a second cell latch coupled to said second pass gate for holding said data value until said second pass gate is activated.

4. The memory device of claim 1, further comprising a test cell connected at a substantially central location of said bitline.

5. The memory device of claim 4, wherein said test cell further comprises:

a test pass gate coupled to said bitline, for passing on a second data value to said bitline when activated by a test wordline signal; and
   a test cell latch coupled to said test pass gate for holding said second data value until said test pass gate is activated,
   wherein said test cell is activated essentially simultaneously to the activation of said first and second memory cell.

6. The memory device of claim 5, wherein for a test mode a same data value is written into said first and second memory cell.

7. The memory device of claim 6, wherein said second data value is a complement of said data value written into said first and second memory cell.

8. The memory device of claim 1, wherein said first memory cell is adjacent to said second memory cell, and said first and second memory cell share said bitline contact.

9. A method for testing the resistance of a bitline contact in a memory device having memory cells comprising the steps of:
   a) writing a data value into adjacent memory cells sharing said bitline contact;
   b) reading said data value from said adjacent memory cells essentially simultaneously; and
   c) comparing said read data value of said adjacent memory cells with said written data value.

10. The method of claim 9, wherein step b) further comprises the steps of:
   b1) providing a wordline logic device;
   b2) transmitting a first and second wordline signal to said adjacent memory cells simultaneously with said wordline logic device; and
   b3) activating said adjacent memory cells essentially simultaneously with said first and second wordline signal.

11. The method of claim 9, further comprising the steps of:
   d) providing a test cell;
   e) writing a same data value into said adjacent memory cells;
   f) writing a complementary value of said data value into said test cell; and
   g) reading said test cell essentially simultaneously to the reading of said adjacent memory cells.

12. The method of claim 11, further comprising the steps of:
   h) comparing said data value read from said adjacent memory cells to said value read from said test cell; and
   i) detecting a resistive bitline contact when said data value read from said adjacent memory cells is different than said value read from said test cell.

13. A SRAM memory array system comprising:
   a plurality of adjacent memory cells;
   a bitline pair for transferring data values to or from said plurality of adjacent memory cells;
   a plurality of bitline contacts coupling said bitline pair to said plurality of adjacent memory cells, each of said plurality of bitline contacts being shared between each of said plurality of adjacent memory cells, respectively;
   a plurality of wordline signals for activating said plurality of adjacent memory cells, for transferring said data values to said bitline pair; and
   a plurality of wordline logic devices, receiving said plurality of wordline signals, each of said plurality of wordline logic devices receiving two of said plurality of wordline signals, and transmitting said plurality of wordline signals to said plurality of adjacent memory cells, wherein during a test of each of said plurality of bitline contacts, each of said plurality of wordline logic devices transmits said two of said plurality of wordline signals to each of said plurality of adjacent memory cells essentially simultaneously.

14. The system of claim 13, wherein each of said plurality of adjacent memory cells further comprises:

a first and second pass gate, coupled to one of said plurality of bitline contacts and to one of said plurality of wordline logic devices, for passing on data values to said bitline pair when activated by said one of said plurality of wordline signals;

a first cell latch coupled to said first pass gate, for holding a first data value until said first pass gate is activated; and a second cell latch coupled to said second pass gate for holding a second data value until said second pass gate is activated.

15. The system of claim 13, further comprising a test cell connected at a substantially central location of said bitline pair.

16. The system of claim 15, wherein said test cell further comprises:

a test pass gate coupled to said bitline pair, for passing on a third data value to one of said bitline pair when activated by a test wordline signal; and a test cell latch coupled to said test pass gate for holding said second data value until said test pass gate is activated, wherein said test cell is activated essentially simultaneously to the activation of each of said plurality of adjacent memory cells.

17. The system of claim 16, wherein for test mode said first and second data value are the same value.

18. The system of claim 17, wherein said third data value is a complement of said first and second data value.

19. The system of claim 13, wherein said bitline pair comprises:

a true bitline for transferring a true value of said data values; and a complementary bitline for transferring a complementary value of said data values.

20. The system of claim 13, wherein a resistance of each of said plurality of adjacent memory cells during test mode is half the resistance of said plurality of adjacent memory cells during system mode.

* * * * *